(12) United States Patent
Done et al.

(10) Patent No.: US 8,163,222 B2
(45) Date of Patent: Apr. 24, 2012

(54) MACHINE HEAD FOR PRODUCTION OF A SURFACE RELIEF

(75) Inventors: Stephen Done, Quorn (GB); Ken Shepherd, Earl Shilton (GB); Phil Carpenter, Cheltenham (GB)

(73) Assignee: API Group PLC, Poynton (GB)

( * ) Notice: Subject to any disclaimer, the term of this patent is extended or adjusted under 35 U.S.C. 154(b) by 0 days.

(21) Appl. No.: 12/709,615

(22) Filed: Feb. 22, 2010

(65) Prior Publication Data

US 2010/0213637 A1    Aug. 26, 2010

(30) Foreign Application Priority Data

Feb. 20, 2009    (GB) .................................. 0902972.9

(51) Int. Cl.
*B28B 11/08*    (2006.01)
(52) U.S. Cl. ........................ 264/293; 427/96.1
(58) Field of Classification Search .................. 264/293
See application file for complete search history.

(56) References Cited

U.S. PATENT DOCUMENTS

| | | |
|---|---|---|
| 2002/0150398 A1 | 10/2002 | Choi et al. |
| 2005/0087911 A1 | 4/2005 | Ford |
| 2008/0145774 A1 | 6/2008 | Kruijt-Stegeman et al. |
| 2008/0160129 A1 | 7/2008 | Resnick et al. |
| 2008/0202365 A1 | 8/2008 | Schneider et al. |

FOREIGN PATENT DOCUMENTS

| | | |
|---|---|---|
| EP | 1072954 A2 | 1/2001 |
| JP | 2113456 A | 10/1988 |
| JP | 08207159 A | 8/1996 |
| JP | 2006303292 A | 11/2006 |
| WO | 2006132119 A1 | 12/2006 |
| WO | 2007099907 A1 | 9/2007 |

OTHER PUBLICATIONS

Extended European Search Report for Application No. EP10154142.3, dated Jun. 16, 2010, 7 pages.
Great Britain Search report for Application No. GB0902972.9, dated Jun. 23, 2010, 1 page.

*Primary Examiner* — Yogendra Gupta
*Assistant Examiner* — John Robitaille
(74) *Attorney, Agent, or Firm* — Rothwell, Figg, Ernst & Manbeck, P.C.

(57) ABSTRACT

A machine head for producing a surface relief on a substrate, the machine head comprising a flexible stamping element having a curved profile and an inverse of the surface relief on its convex side; and the flexibility of the element being such that the inverse of the surface relief can be pressed to become flat and in planar contact with the substrate being pressed.

16 Claims, 2 Drawing Sheets

MACHINE HEAD FOR PRODUCTION OF A SURFACE RELIEF

FIELD OF INVENTION

The present invention relates to a machine and in particular a machine head used in the production of a surface relief on a substrate and a method for producing a surface relief on a substrate.

BACKGROUND

Certain devices comprise or make use of a surface relief micro-structure. Examples of devices which require an accurate production of a surface micro-structure include holograms, optically variable devices (OVDs), Fresnel lenses and e-beam and lithography originations. For the purposes of repeated production of a particular device, the surface relief micro-structure must be copied many times.

One known way of copying a surface relief micro-structure is using a standard press having a head to which an inverse relief of the micro-structure to be copied is attached. The press is operated such that the head is pressed into a heated thermoplastic, thereby forming the required relief in the thermoplastic. When the thermoplastic cools and sets, the relief is set within the plastic.

There are various problems with the thermoplastic method. Firstly, there is a limitation on the accuracy of the relief which can be set and this accuracy is often insufficient for the quality of product required. Secondly, there are limitations on the depth, feature aspect ratios and complexity of relief that can be produced. Thirdly, the high pressure with which the inverse relief is pressed into the thermoplastic causes damage to the inverse relief over multiple copies, thus necessitating replacement of the inverse relief more often than is desirable when mass-producing a particular product. Fourthly, the action of bringing a press down onto the thermoplastic can result in the entrapment of air bubbles which has an adverse affect on the quality of the relief produced. Equally, removal of the head can cause a problem because the head is liable to stick to the thermoplastic and thereby damage the produced relief.

It would be desirable to provide an improved machine head and method for producing a surface relief on a substrate.

SUMMARY OF THE INVENTION

According to a first aspect of the present invention there is provided a machine head for producing a surface relief on a substrate, the machine head comprising: a flexible element having a curved profile and an inverse of the surface relief on its convex side; and the flexibility of the element being such that the inverse of the surface relief can be pressed to become substantially flat and in substantially planar contact with the substrate being pressed.

The flexible element may be a stamp carrier; the machine head may further comprise a stamp applied to the convex side of the stamp carrier; and the stamp may comprise the inverse of the surface relief.

The machine head may further comprise: a pressure pad on the opposite side of the flexible element to the inverse of the surface relief; and wherein the pressure pad may be capable of applying pressure to the flexible sheet when the inverse of the surface relief is pressed to become flat. The pressure pad may be initially spaced away from the flexible element.

The curved profile of the flexible element may be formed by a bowing of the flexible element.

The machine head may further comprise: one or more swivelling mounts, each swivelling mount being capable of holding the flexible element. The machine head may comprise two or more swivelling mounts, and the curved profile of the flexible element is formed by holding a part of the flexible element between the swivelling mounts. The distance between the swivelling mounts may be less than the length of the part of the stamping element held between the swivelling mounts.

The surface relief may be used in the production of a hologram.

According to a second aspect of the present invention there is provided a method for producing a surface relief on a substrate using a flexible element having a curved profile and an inverse of the surface relief on its convex side, the method comprising the steps of: bringing the convex side of the flexible element in to contact with the substrate; and flattening the profile of the flexible element such that the inverse of the surface relief is in substantially flat and substantially planar contact with the substrate.

The method may comprise the further steps of: moving the flexible stamping element towards the substrate such that the area of the inverse of the surface relief in contact with the substrate increases; and stopping the movement of the flexible stamping element towards the substrate when the whole area of the inverse of the surface relief is in contact with the substrate.

The method may further comprise the further step of: moving the flexible element away from the substrate until the inverse of the surface relief is not in contact with the substrate by restoring the curved profile of the flexible element.

BRIEF DESCRIPTION OF THE DRAWINGS

Embodiments of the invention will now be described, by way of example only, with reference to the accompanying drawings in which.

In the figures, like reference numerals indicate like parts.

DETAILED DESCRIPTION OF PREFERRED EMBODIMENTS

The machine head described below is for use in the production of a surface relief on a substrate. The machine head is designed to operate as part of a machine to perform a production method which can be used to make multiple copies of a surface relief. The machine head has a flexible stamping element with a curved profile and an inverse impression of the surface relief on its convex side. The flexibility of the stamping element is such that when it is pressed in to contact with the substrate the stamping element can flatten so the inverse of the surface area can be in planar contact with the substrate.

Figure 1:
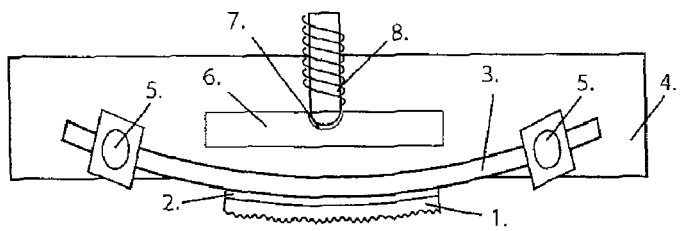
FIG. 1 shows a preferred embodiment of a machine head of the invention.

FIG. 1 shows an embodiment of a machine head 4 for producing a surface relief on a substrate. The inverse profile of the surface relief to be stamped is present on the surface of a flexible shim 1. The shim 1 in this embodiment is made of nickel but could, for example, be manufactured from a nickel alloy, or an alternative material that allows the required surface relief to be produced in the flexible shim 1. The flexible shim 1 is attached to a spring sheet 3 by use of a pressure sensitive adhesive 2. The spring sheet 3 is arranged to have a curved profile and the flexible shim 1 is attached to the convex side of the spring sheet 3. In this embodiment the spring sheet is made of steel.

Two swivelling clamp units 5 are fitted to the head unit 4. The two clamp units 5 are positioned such that a line between the clamp units 5 is perpendicular to the stamping direction. The clamp units 5 are connected in the head unit 4 such that they are held positionally fast but are rotationally free in the plane of the figure. The clamp units 5 are able to accept the spring sheet 3 and can be tightened to hold the spring sheet 3 in position. The tightening of the clamp units 5 also secures the rotational angle of the clamp units 5. The curved, bowed profile of the spring sheet 3 is provided by the clamp units 5 using the rotational property of each clamp unit 5. When the spring sheet 3 is placed in the two clamp units 5 such that it extends between them, the clamp units 5 can be rotated such that the distance between the points of the clamp units 5 at which the spring sheet 3 is held is less than the length of the spring sheet 3 between the two clamp units 5. This difference in distance to length means that the spring sheet 3 is in compression and so has the required bowed, curved profile for the stamping operation.

The rotational position of the clamp units 5 may be adjusted so that the curvature, or bow, of the spring sheet 3 is altered. The specific curvature, or bow, of the spring sheet 3 will provide a specific response in the stamping operation described later.

The machine head 4 also includes a pressure pad 6 situated on the opposite side of the spring sheet 3 to the flexible shim 1. The pressure pad 6 extends laterally and generally parallel to the spring sheet 3. When the machine head is in a non-operative state, and/or before spring sheet 3 is flattened, the pressure pad 6 is restrained so that the pressure pad 6 is spaced away from the spring sheet 3. The pressure pad 6 is attached to a resilient support section 8. This support section 8 provides resistance to the pressure pad 6 moving in a direction away from the spring sheet 3.

The pressure pad 6 is attached to the support section 8 by means of a rotationally-free mount 7, in this embodiment a gimbal mount. It will be apparent that other types of mount could be used. When using the rotationally-free mount 7 the pressure pad 6 is free to move and thus change the angle between the pressure pad 6 and the spring sheet 3. This means the pressure pad 6 can move to provide a better contact between the pressure pad 6 and the spring sheet 3.

The resilient support section 8 includes a spring for selecting the level of resistance provided by the pressure pad 6 to the spring sheet 3. When the spring is compressed it will push against the pressure pad 6 and thus provide resistance against the pressing action to the pressure pad 6. It will be appreciated by those skilled in the art that other means of adjustment could be used.

The spacing present, prior to pressing, between the pressure pad 6 and the spring sheet 3 allows the spring sheet 3 to flatten at a gradual rate when pressure is applied to the flexible shim side of the spring sheet 3. Only when the spring sheet 3 is sufficiently flattened will it come in to contact with the pressure pad 6.

The spring sheet 3 does not have to provide all of the resistance required when the spring sheet 3 is being flattened because the pressure pad 6 is used. The spring sheet 3 is pushed in to contact with the pressure pad 6 and then the pressure pad 6 provides the required pushing force.

Figure 5:
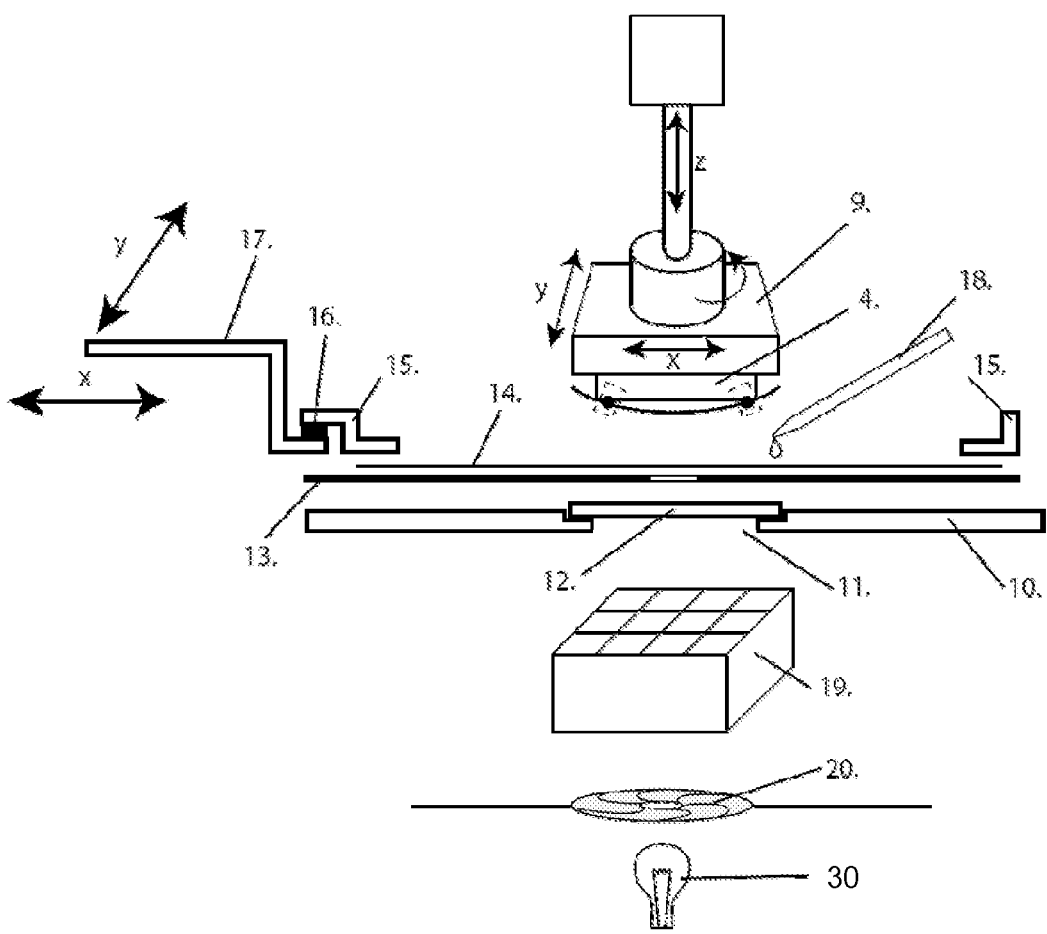
FIG. 5 shows the head in a machine for forming impressions in resin.

It will be understood by those skilled in the art that the above-described machine head 4 is used within a machine that holds a substrate in which the relief is to be produced. The head 4 may be operated by hydraulic means and may be electronically controllable as known in the art. In one convenient embodiment, the head is moveable relative to the substrate substantially in the plane of the substrate. For this purpose the head may be borne on a carriage 9 (FIG. 5) that can automatically be moved in orthogonal (x and y) directions substantially parallel to the plane of the substrate. In that way, the head can be indexed to a desired position and then caused to move into proximity with the substrate at that location. The carriage 9 could also be moved rotationally in the x-y plane, so that the head 4 can be rotated about an axis substantially perpendicular to the plane of the substrate.

Figure 2:
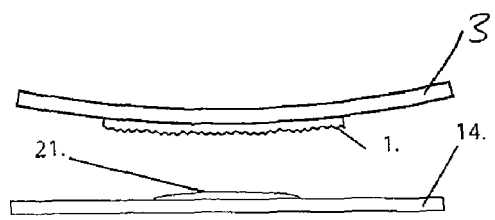
FIG. 2 shows the initial position of some elements of a machine used in accordance with the invention.

The required flexibility of the spring sheet 3 will be described with reference to the pressing action in which the machine head 4 is used. FIG. 2 shows a starting position for the machine head 4. For simplicity only the spring sheet 3 and the flexible shim 1 are shown. Underneath the spring sheet 3 and flexible shim 1 is shown a substrate 14 into which the surface relief is to be formed. A suitable material for the substrate 14 is 250 micron print treated polyester although other thicknesses and other polymers can be used. The substrate 14 in this embodiment has a layer 21 of liquid resin on an area of its surface and the substrate is held such that this layer 21 of resin lies below the flexible shim 1. The layer 21 of resin does not initially extend underneath the full area of the shim 1 because it will be dispersed during the pressing process as described below. It can be readily appreciated that the layer of resin can be applied, prior to pressing by the machine head 4, to the substrate in situ by a resin dispensing system forming part of the machine as known in the art. The resin 21 is chosen such that it adheres preferentially to the substrate 14 over the shim 1 so as to minimise the risk of damaged to the formed relief when the head 4 is moved back up after the pressing process.

Figure 3:
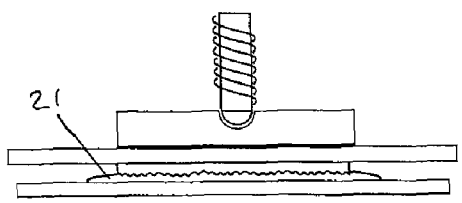
FIG. 3 shows the position of the elements of FIG. 2 whilst stamping of a relief occurs.

The curved, or bowed, profile of the spring sheet 3 and thus the flexible shim 1 means that when the head 4 is operated to move the spring sheet 3 towards the substrate 14 the flexible shim 1 first makes contact with the resin 21 placed on the substrate 14, only at a limited central line (in a direction into the page as shown in the figures) or central point. As the flexible shim 1 is pressed by the spring sheet 3 on to the substrate 14 the curved profile is flattened first at this limited central line or point. The flattening then extends outwards from this central line or point until the whole of the inverse of the surface relief present on the flexible shim 1 is in planar contact with the substrate, or the material 21 placed on the substrate, as shown in FIG. 3.

This flattening of the curved, or bowed, profile of the spring sheet 3 and the flexible shim 1 means that the resin 21 is compressed in such a way that it can flow laterally. This inhibits the entrapment of air bubbles underneath the inverse of the surface relief present on the flexible shim 1. The flattening also enables the resin 21 to be smoothed as the pressing action proceeds. This leads to a suitably flat layer of resin 21.

During this pressing step the inverse of the surface relief pattern is pressed in to the surface of the resin 21, thereby forming a relief pattern in the resin 21. The head 4 is moved towards the substrate 14 by a set distance so that the pressing of the resin 21 causes the resin 21 to spread in to a thin film. Alternatively, the head 4 is moved towards the substrate 14 until a set force is applied on the resin 21.

The combination of the flattening and pressure applied being such that the resin 21 spreads in to a thin film of the required thickness. The thickness of the resin 21 is typically 2-3 microns; however the resin 21 could be pressed to be thicker or thinner than this range during pressing if required. For example, a thickness of 2-3 microns may be required in the production of a hologram, or diffractive optical structure; however other thicknesses may be needed to produce Fresnel lenses, optically variable devices (OVDs), e-beam and lithography originations.

Figure 4:
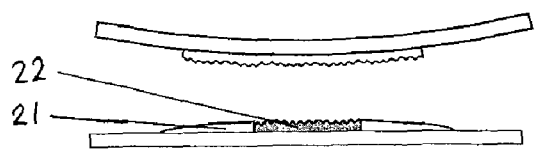
FIG. 4 shows the final position of the elements of FIGS. 2 and 3.

The area of the resin 21 in which the relief has been formed needs to be cured at this stage so that the surface relief pattern remains in the surface of the resin 21 after the flexible shim 1 is removed. Means for such curing could include, for example, the use of heat, or a UV light source 30 (see FIG. 5), which can form part of the machine in which the machine head 4 operates. Alternatively, the resin could be cured using nuclear curing or by exposure to an electron beam source. FIG. 4 shows a cured area of material 22. The machine may also include a shutter system 20 (see FIG. 5) to control the exposure of the heat or light source to the resin 21. A mask 19 may be placed between the substrate 14 and the light source to control the pattern of heat or light source to the resin 21. The radiation curable resins could include Radcure resins, such as Radcure 801 FCX.

In one convenient embodiment, the mask is configured so as to block light from the light source from reaching the substrate except in a selected area, that area being defined by a transparent window in the otherwise opaque mask. The mask is preferably movable relative to the substrate substantially in the plane of the substrate. For this purpose the mask may be borne on a carriage that can automatically be moved in orthogonal (x and y) directions substantially parallel to the plane of the substrate. In that way, the mask can be indexed to a desired position. The light source may move with the mask. Conveniently, the resin is exposed through the substrate, since then the mask can be on the opposite side of the substrate from the head. Alternatively, the mask may be fixed in position, and the substrate may be moved by a carriage system comprising rails 15, 17 and bearings/linear motor 16. In that case, a separate motion mechanism for the head could be omitted.

The area defined by the window is preferably the same size as, or smaller than the region impressed with a desired pattern by the head, and preferably coincides with the location of that impressed region. In that way, the resin can be cured only in the region impressed with the desired pattern. Once the resin is cured the head can be lifted from the substrate. Excess uncured resin can then be washed away, or impressed later with a desired pattern, leaving the only cured resin on the substrate as being resin that includes the desired pattern. To achieve this, the equipment may be configured so that the mask and the head move in unison in the plane of the substrate, with the window being in register with the patterned region of the head.

Resin can be applied uniformly to the substrate prior to stamping, or just in the region desired to be impressed at a particular time. In one example, resin can be applied uniformly to the substrate (e.g. by a roller), and then stamped and cured in a series of spaced apart or contiguous regions. In another example, resin can be applied to a selected part of the substrate, for example by means of dropper 18 (FIG. 5) and part or all of that resin can be impressed and cured. Then additional resin may be applied in a region adjacent to or spaced from the cured resin and the process repeated. Using such techniques a desired pattern can be replicated over a large area by repeated pressing and curing steps.

The machine head can then be moved away from the substrate 14. When this occurs the curved profile of the spring sheet 3 and the flexible shim 1 will be restored. The edges of the flexible shim 1 will first lift away from the substrate 14 or the material 21. This lifting action will continue until the central point is finally removed from being in contact with the material 21, or substrate 14.

The ability of the spring sheet 3 to form a curved, or bowed, profile means that when the machine head is moved away from the substrate 14 a peeling action occurs between the surface of the flexible shim 1 in contact with the resin 21 and the resin 21. This enables the flexible shim to be separated from the resin cleanly and thereby avoids sticking to the shim 1 of parts of the resin 21 in which the relief is formed. It avoids the plucking effect that can occur when using a rigid stamping head.

It will be appreciated by those skilled in the art that alternatives to aspects of the above-described embodiments are possible. For example, the spring sheet 3 could alternatively have some other structure provided that the flexibility requirements are fulfilled by the other structure. For example, a solid elastomer could be used provided that it could be arranged in a curved profile similar to that of the spring sheet 3 and then have the ability to be flattened during use.

Instead of the structure shown in the figures where the flexible shim 1 comprising the inverse of the surface relief is attached to the spring sheet 3, the inverse relief could alternatively be integrated in to the spring sheet 3 or other structure. For example, a solid elastomer could have the inverse of the surface relief directly imposed or carved in to the convex surface of the solid elastomer. The spring sheet 3 could have a similar carving or embossing in its surface.

If the spring sheet 3 is replaced by some other structure as described above, then the clamp units 5 as described may not be required. A different form of clamp unit may be required to hold the some other structure in place. Alternatively the adjustment provided by the rotational position of the clamp units 5 may not apply to the other structure. In the case of some other structure being used in place of the spring sheet 3 the equivalent properties to the curvature, or bow, of the spring sheet 3 would be selected by the material used to create the other structure. For the elastomer example, a polymer would be chosen with the specific elastic properties required for the stamping operation to be undertaken.

The selection of the material used in the spring sheet 3 may be such that it provides the required pressure when the spring sheet 3 is being flattened. Therefore a separate pressure pad 6 may not be required. However, the selection of the material of the spring sheet 3 can be simplified by the use of the pressure pad 6.

Although it is preferable to use the liquid resin 21 on the substrate 14, as an alternative the substrate 14 could be provided with some kind of malleable material present on the surface. Alternatively the material of the substrate could be chosen such that the substrate itself is the item that is to be pressed by the machine head. An advantage of use of a resin 21 is that it minimises damage to the inverse relief on the shim 1 over multiple use.

As described above, the machine in which the machine head 4 operates can be used to produce multiple impressions of the inverse profile of the surface relief to be stamped that is present on the surface of a flexible shim 1. For example, over a hundred impressions of the inverse profile could be made side by side. This produced multiple impression can then be used in an embossing machine to produce a continuous run of the hologram or other optical structure. For example, the substrate bearing the cured resin could be coated with silver and then used as a master to form a nickel shim. That nickel shim could be used as a stamping die, for example to form holograms in a hot or cold foil stamping process. Using the techniques described above, the nickel shim can be made with repeated patterns formed by repeated pressing of the head in different locations on the substrate. This makes the process particularly useful for making shims for high volume stamping (e.g. for security applications) or for applications that require a continuous area of stamped pattern (e.g. a ribbon or sheet).

The resin is conveniently a fluid that can be hardened, for example by curing/polymerisation. For that purpose, the resin may be a fluid comprising monomers, oligomers or other polymer precursors, optionally in a solvent or carrier. The solvent or carrier may be volatile. The monomers, oligomers or precursors may be capable of polymerising to harden the fluid. The fluid may include one or more photoinitiators, accelerators or other components to promote suitable polymerisation behaviour.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A machine head for producing a surface relief on a substrate, the machine head comprising:
two or more swivelling mounts connected to the machine head so that the swivelling mounts are held positionally fast but are rotationally free with respect to the machine head such that, during production of a surface relief on the substrate, the swivelling mounts remain positionally fast but rotationally free with respect to the machine head;
a flexible element having:
a curved profile formed by holding a part of the flexible element between the swivelling mounts, and
an inverse of the surface relief on its convex side; and
wherein the flexibility of the element is such that the inverse of the surface relief is capable of being pressed to become substantially flat and in substantially planar contact with the substrate being pressed.

2. A machine head as claimed in claim 1, wherein the flexible element is a stamp carrier; the machine head further comprises a stamp applied to the convex side of the stamp carrier; and the stamp comprises the inverse of the surface relief.

3. A machine head as claimed in claim 1, the machine head further comprising:
a pressure pad on the opposite side of the flexible element to the inverse of the surface relief;
and wherein the pressure pad is capable of applying pressure to the flexible sheet when the inverse of the surface relief is pressed to become flat.

4. A machine head as claimed in claim 3, wherein the pressure pad is initially spaced away from the flexible element.

5. A machine head as claimed in claim 1, wherein the curved profile of the flexible element is formed by a bowing of the flexible element.

6. A machine head as claimed in claim 1, wherein the distance between the swivelling mounts is less than the length of the part of the stamping element held between the swivelling mounts.

7. A machine head as claimed in claim 1, wherein the surface relief is used in the production of a hologram.

8. A method for producing a surface relief on a substrate using a machine head comprising two or more swivelling mounts and a flexible element having a curved profile and an inverse of the surface relief on its convex side, the method comprising the steps of:
connecting the swivelling mounts in the machine head so that the swivelling mounts are held positionally fast but are rotationally free with respect to the machine head such that, during production of a surface relief on the substrate, the swivelling mounts remain positionally fast but rotationally free with respect to the machine head;
forming the curved profile of the flexible element by holding a part of the flexible element between the swivelling mounts;
bringing the convex side of the flexible element into contact with the substrate; and
flattening the profile of the flexible element such that the inverse of the surface relief is in substantially flat and substantially planar contact with the substrate.

9. A method as claimed in claim 8, comprising the further steps of:
moving the flexible stamping element towards the substrate such that the area of the inverse of the surface relief in contact with the substrate increases; and
stopping the movement of the flexible stamping element towards the substrate when the whole area of the inverse of the surface relief is in contact with the substrate.

10. A method as claimed in claim 8, further comprising the further step of:
moving the flexible element away from the substrate until the inverse of the surface relief is not in contact with the substrate by restoring the curved profile of the flexible element.

11. A machine head as claimed in claim 1, wherein the flexible element is a spring sheet.

12. A method as claimed in claim 9, further comprising the further step of:
moving the flexible element away from the substrate until the inverse of the surface relief is not in contact with the substrate by restoring the curved profile of the flexible element.

13. A method as claimed in claim 8, further comprising the step of:
altering the curvature of the flexible element by adjusting the length of the flexible element between the swivelling mounts.

14. A method as claimed in claim 9, further comprising the step of:
altering the curvature of the flexible element by adjusting the length of the flexible element between the swivelling mounts.

15. A method as claimed in claim 10, further comprising the step of:
altering the curvature of the flexible element by adjusting the length of the flexible element between the swivelling mounts.

16. A method as claimed in claim 12, further comprising the step of:
altering the curvature of the flexible element by adjusting the length of the flexible element between the swivelling mounts.

* * * * *